(12) United States Patent
Liu

(10) Patent No.: US 8,453,837 B1
(45) Date of Patent: Jun. 4, 2013

(54) ELECTRONIC DEVICE ENCLOSURE

(71) Applicant: Fu-Ming Liu, Shenzhen (CN)

(72) Inventor: Fu-Ming Liu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/632,404

(22) Filed: Oct. 1, 2012

(30) Foreign Application Priority Data

Dec. 26, 2011 (CN) .......................... 2011 1 0441245

(51) Int. Cl.
*B65D 85/30* (2006.01)
(52) U.S. Cl.
USPC ..... 206/320; 16/110.01; 16/425; 361/679.01; 220/759
(58) Field of Classification Search
USPC .............. 206/320, 576, 701; 16/110.1, 114.1, 16/406, 407, 408, 422, 425, DIG. 24, DIG. 25, 16/FOR. 124, FOR. 125, FOR. 110, FOR. 104, 16/FOR. 105; 361/679.01, 679.02; 220/752, 220/759, 760, 761, 768
See application file for complete search history.

(56) References Cited

U.S. PATENT DOCUMENTS

| | | | | | |
|---|---|---|---|---|---|
| 2,612,308 | A | * | 9/1952 | Potts | 229/117.19 |
| 5,845,978 | A | * | 12/1998 | Jung | 312/244 |
| 5,933,917 | A | * | 8/1999 | Lo | 16/439 |
| 6,480,398 | B1 | * | 11/2002 | Fiora et al. | 361/816 |
| 6,659,276 | B2 | * | 12/2003 | Anderson et al. | 206/349 |
| 7,516,520 | B2 | * | 4/2009 | Kelaher et al. | 16/445 |
| 2010/0257697 | A1 | * | 10/2010 | Ramsauer | 16/110.1 |

* cited by examiner

*Primary Examiner* — Jacob K Ackun
(74) *Attorney, Agent, or Firm* — Altis Law Group, Inc.

(57) ABSTRACT

An electronic device enclosure includes a side plate, a fixing member, and a handle pivotally mounted on the fixing member. The side plate defines a depression portion therein. The fixing member is mounted in the depression portion. The fixing member includes two fixing portions and at least one elastically resisting portion. The two fixing portions are aligned in a line. The handle includes two mounting portions extending in the two fixing portions in a first direction. The at least one elastically resisting portion abuts the handle to prevent the handle from moving out of the two fixing portions in a second direction that is opposite to the first direction.

19 Claims, 5 Drawing Sheets

ELECTRONIC DEVICE ENCLOSURE

BACKGROUND

1. Technical Field

The present disclosure relates to an electronic device enclosure with a handle.

2. Description of Related Art

Electronic devices such as personal computers and servers sometimes need to be moved in use. Some of electronic devices have handles extending from cases of these electronic devices to facilitate moving. These handles often extend to away from the electronic devices, which occupies a space of the electronic devices.

Therefore there is a need for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
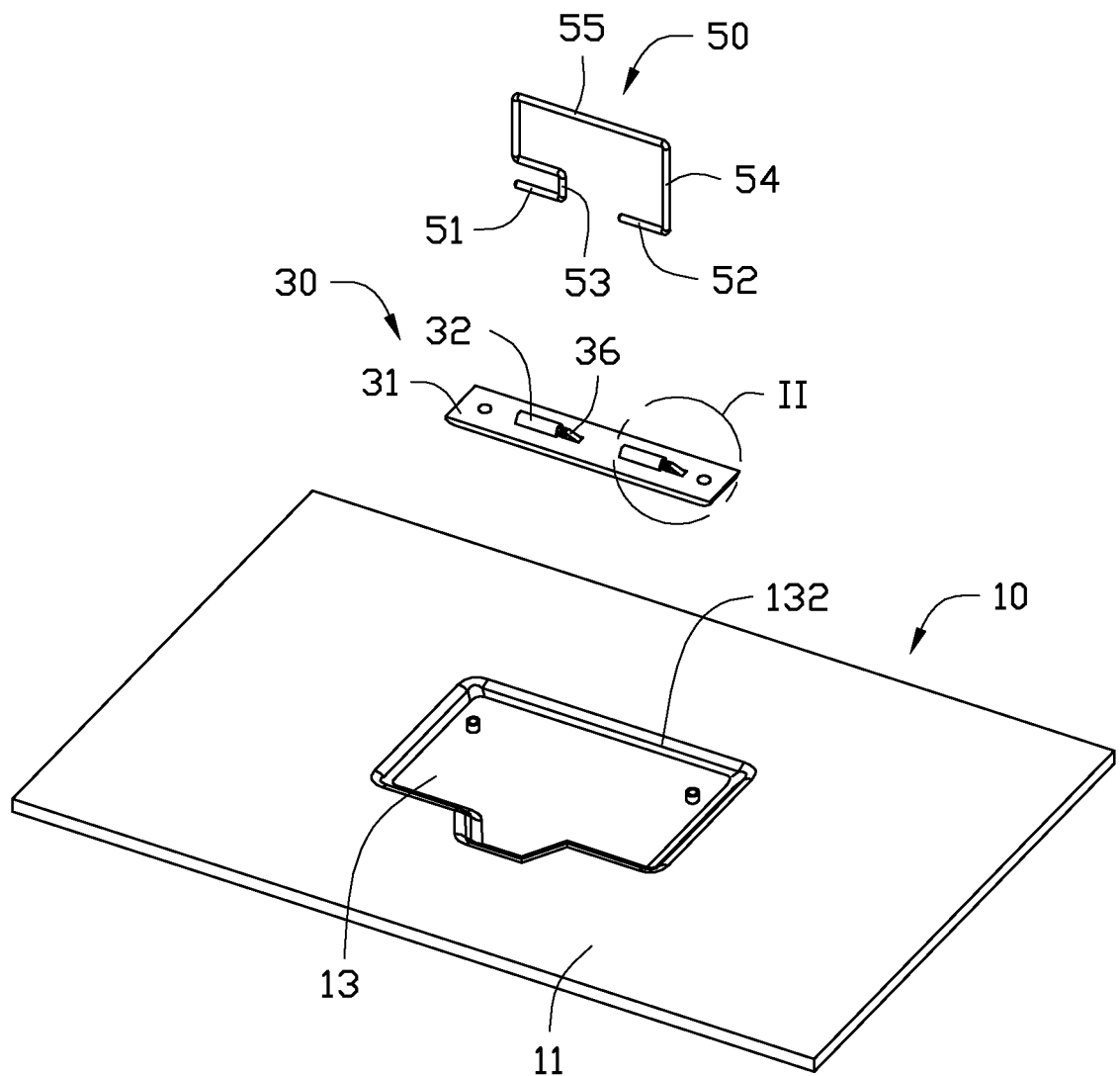
FIG. 1 is an exploded, isometric view of an embodiment of an electronic device enclosure.

FIG. 1 illustrates an electronic device enclosure in accordance with an embodiment. The electronic device enclosure includes a side plate 10, a fixing member 30 mounted on the side plate 10, and a handle 50 pivotally mounted on the fixing member 30.

The side plate 10 includes an outer surface 11 and a depression portion 13 defined in the outer surface 11. A plurality of diagonal fringe portions 132 are located between side edges of the depression portion 13 and the outer surface 11. In one embodiment, the depression portion 13 is approximately rectangular-shaped. The fringe portions 132 are arc-shaped. In another embodiment, the depression portion 13 can also be T-shaped, circular-shaped, or oval-shaped, etc.

Figure 2:
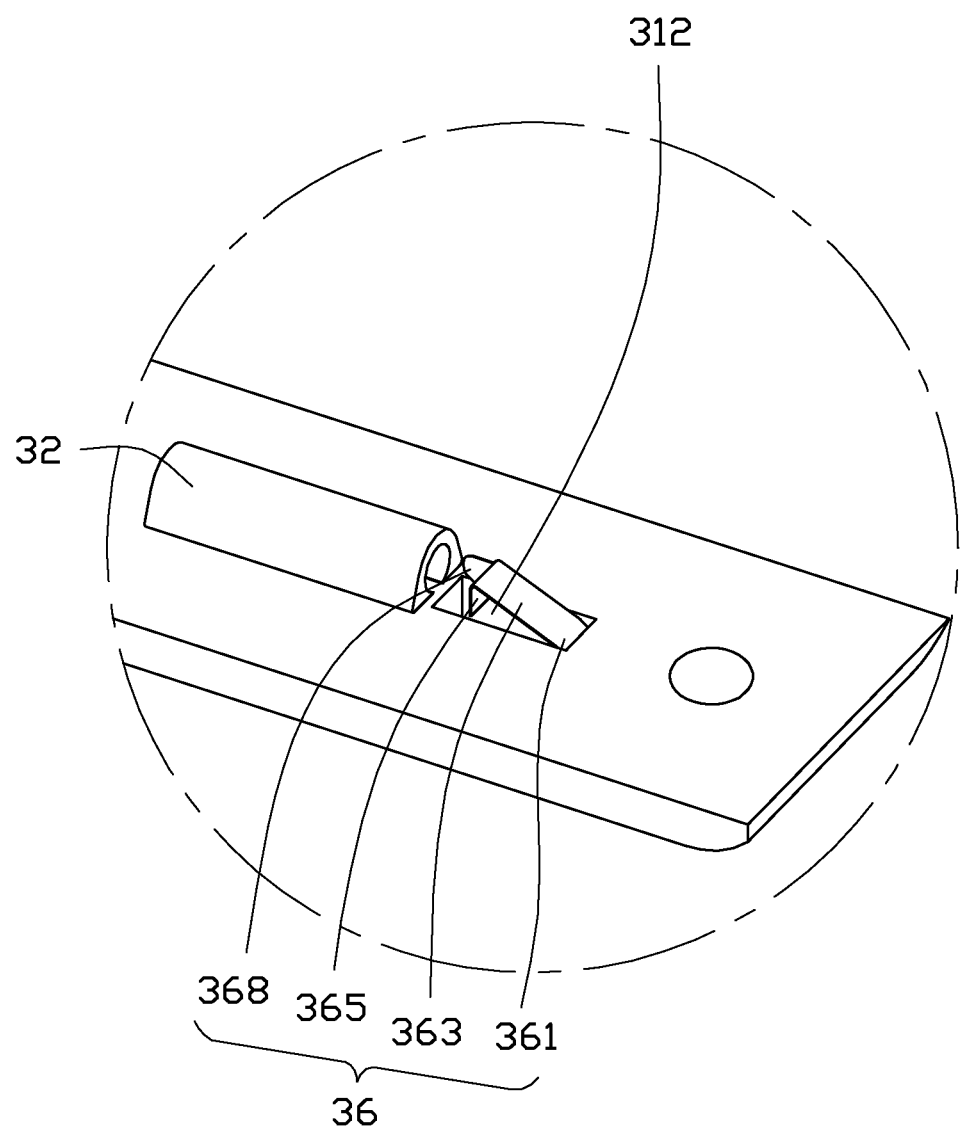
FIG. 2 is an enlarged view of a circled portion II of FIG. 1.

FIG. 2 illustrates the fixing member 30 in accordance with one embodiment. The fixing member 30 is bar-shaped and is mounted in the depression portion 13. The fixing member 30 includes a body portion 31, two fixing portions 32, and two elastically resisting portions 36. Two slots 312 are defined in the body portion 31 beside the two fixing portions 32 respectively. The two elastically resisting portions 36 are located in the two slots 312 respectively. The two fixing portions 32 are aligned linearly on the body portion 31. The two fixing portions 32 are column-shaped and hollow in the middle. Each of the two elastically resisting portions 36 includes an elastically bending portion 361 connected to the body portion 31, a connection portion 363, an abutting portion 365 extending downwardly from a distal end of the connection portion 363, and a restriction portion 368 extending diagonally from the distal end of the connection portion 363. In a normal state, the two elastically resisting portions 36 protrude away from a top surface of the body portion 31. The elastically bending portion 361 and the connection portion 363 are diagonally located on the body portion 31. In one embodiment, the abutting portion 365 is substantially perpendicular to the connection portion 363. A thickness of the fixing member 30 is less than or equal to a depth of the depression portion 13.

The handle 50 includes two mounting portions 51 and 52, two extending portions 53 and 54 connected to the two mounting portions 51 and 52 respectively, and an operation portion 55 connected to the two extending portions 53 and 54. The two mounting portions 51 and 52 extend from the handle 50 along the same direction. The two extending portions 53 and 54 and the operation portion 55 cooperatively form a rectangular-shaped operation space.

Figure 3:
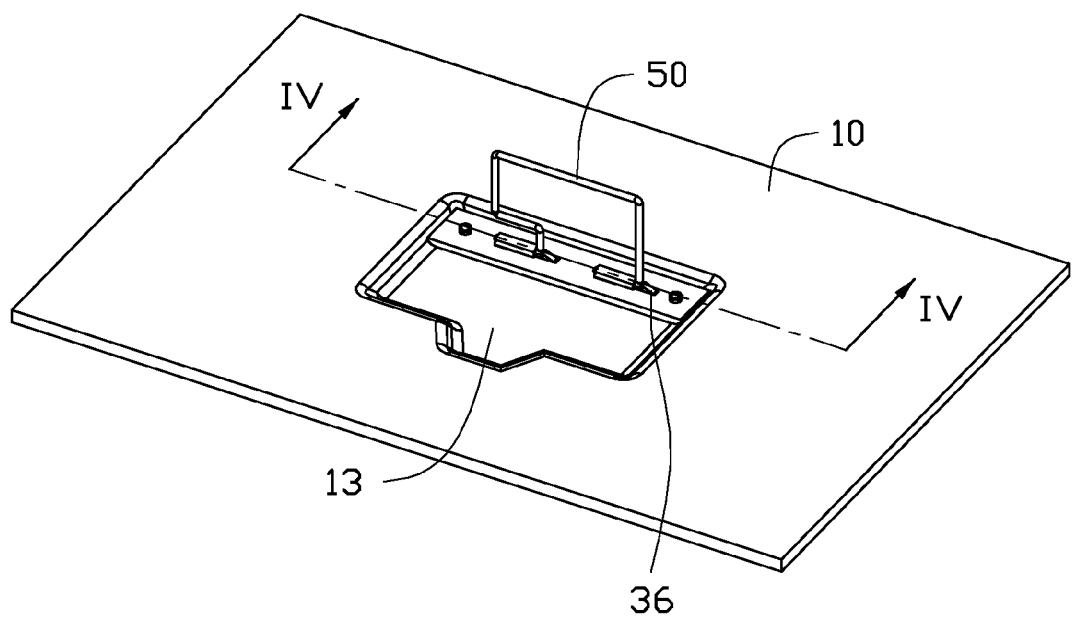
FIG. 3 is an assembled view of the electronic device enclosure of FIG. 1.
Figure 4:
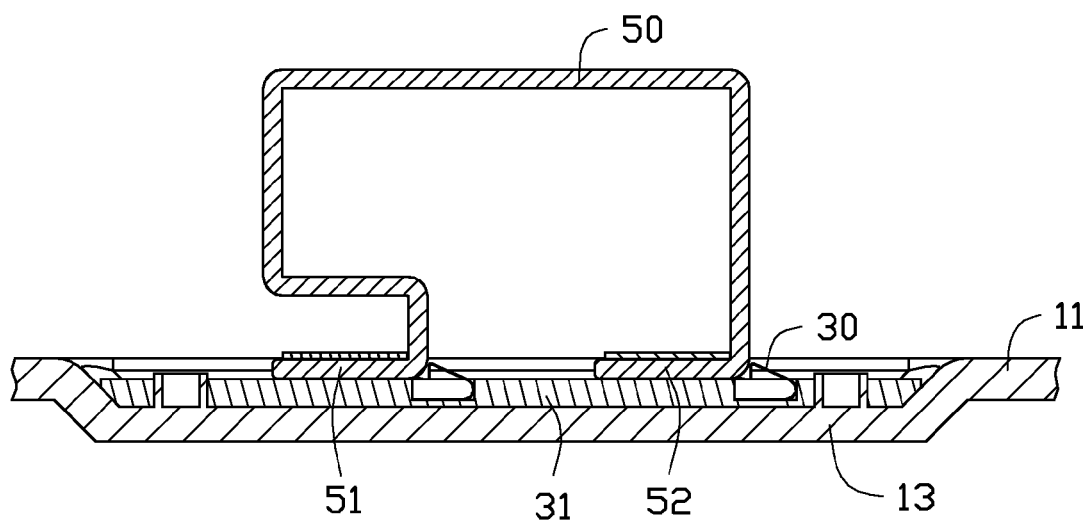
FIG. 4 is a cross-sectional view of the electronic device enclosure of FIG. 3, taken along line IV-IV.

Referring to FIGS. 3 and 4, in assembly, the fixing member 30 is riveted in the depression portion 13. The two mounting portions 51 and 52 of the handle 50 are located on one side of the two fixing portions 32 respectively. The handle 50 is moved toward the two fixing portions 32. The two mounting portions 51 and 52 abut against the connection portions 363 of the two elastically resisting portions 36 respectively. The two elastically resisting portions 36 elastically deform in the corresponding slots 312. The two mounting portions 51 and 52 are extended in the corresponding fixing portions 32 along a first direction. When the two mounting portions 51 and 52 are completely received in the corresponding fixing portions 32, the two elastically resisting portions 36 elastically return to the normal state. The abutting portions 365 of the two elastically resisting portions 36 abut two back ends of the two mounting portions 51 and 52 respectively to prevent the handle 50 from moving in a second direction that is opposite to the first direction. The restriction portions 368 of the two elastically resisting portions 36 abut against two lower portions of the two extending portions 53 and 54 respectively to prevent the handle 50 from moving in a third direction that is perpendicular to the first direction. The operation portion 55 of the handle 50 can be pivotally rotated around the two fixing portions 32.

Figure 5:
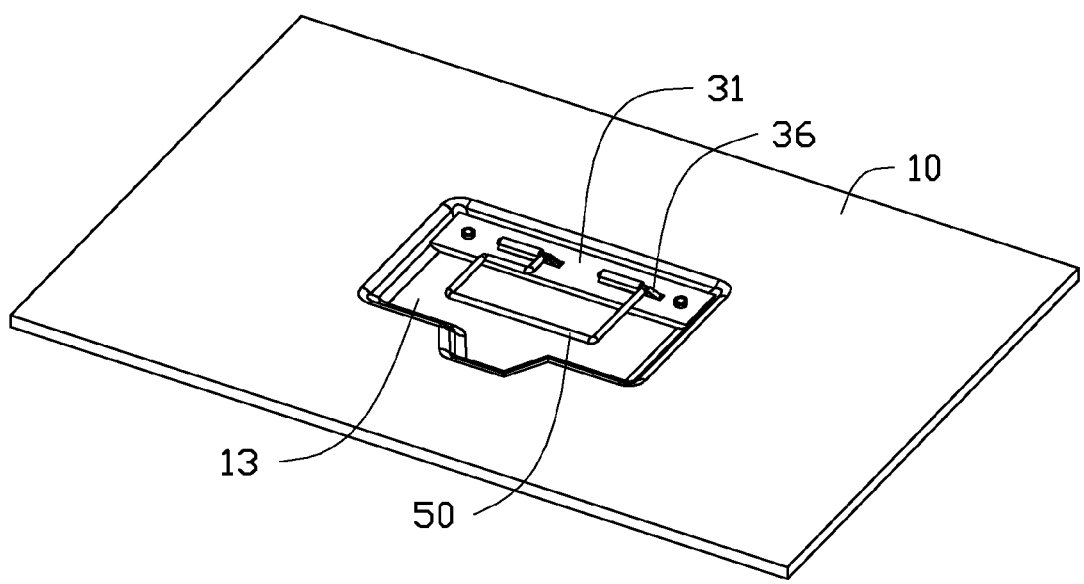
FIG. 5 is similar to FIG. 3, but shows the assembled view of the electronic device enclosure in another position.

Referring to FIG. 5, in use, the operation portion 55 is pivotally rotated around the two fixing portions 32 to an angle relative to the outer surface 11 of the side plate 10. The electronic device enclosure is then moved to a desired place by lifting the operation portion 55. When the electronic device enclosure is moved to the desired place, the operation portion 55 is pivotally rotated around the two fixing portions 32 to be received in the depression portion 13 again.

In another embodiment, a single elastically resisting portion 36 is located on the fixing member 30 to prevent the handle 50 from moving in the second direction, out of the two fixing portions 32. The fixing member 30 can also be mounted in the in the depression portion 13 by fasteners, such as screws, or other fixing means.

Even though numerous characteristics and advantages of the present disclosure have been set forth in the foregoing description, together with details of the structure and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. An electronic device enclosure comprising:
a side plate defining a depression portion therein;
a fixing member mounted in the depression portion; the fixing member comprises two fixing portions and at least one elastically resisting portion; the two fixing portions are aligned in a line; and
a handle pivotally mounted on the fixing member; the handle comprises two mounting portions extending in the two fixing portions in a first direction; and the at least one elastically resisting portion abuts the handle to prevent the handle from moving out of the two fixing portions in a second direction that is opposite to the first direction.

2. The electronic device enclosure of claim 1, wherein the depression portion is approximately rectangular-shaped.

3. The electronic device enclosure of claim 1, wherein a plurality of diagonal fringe portions are located around side edges of the depression portion.

4. The electronic device enclosure of claim 1, wherein the handle further comprises two extending portions connected to the two mounting portions and an operation portion connected to the two extending portions.

5. The electronic device enclosure of claim 4, wherein the two mounting portions extend from the handle along a same direction; and the two extending portions and the operation portion cooperatively form a rectangular-shape operation space.

6. The electronic device enclosure of claim 1, wherein the fixing member comprises a body portion; at least one slot is defined in the body portion; and the at least one elastically resisting portion is received in the at least one slot.

7. The electronic device enclosure of claim 6, wherein the at least one elastically resisting portion comprises an elastically bending portion connected to the body portion, a connection portion, and an abutting portion extending downwardly from a distal end of the connection portion; and the at least one elastically resisting portion protrudes from a top surface of the body portion.

8. The electronic device enclosure of claim 7, wherein the abutting portion is substantially perpendicular to the connection portion.

9. The electronic device enclosure of claim 7, wherein the at least one elastically resisting portion further comprises a restriction portion extending diagonally from the distal end of the connection portion; and the restriction portion abuts the handle to prevent the handle from moving in a third direction that is perpendicular to the first direction.

10. The electronic device enclosure of claim 1, wherein a thickness of the fixing member is less than or equal to a depth of the depression portion.

11. An electronic device enclosure comprising:
a side plate;
a fixing member mounted on the side plate; the fixing member comprises two fixing portions and an elastically resisting portion; the two fixing portions are aligned in a line; and
a handle pivotally mounted on the fixing member; the handle comprises two mounting portions, two extending portions connected to the two mounting portions, and an operation portion connected to the two extending portions; the two mounting portions extends in the two fixing portions in a first direction; and the elastically resisting portion abuts the handle to prevent the handle from moving out of the two fixing portions in a second direction that is opposite to the first direction.

12. The electronic device enclosure of claim 11, wherein a depression portion is defined in the side plate; the fixing member is mounted in the depression portion; and the depression portion is approximately rectangular-shaped.

13. The electronic device enclosure of claim 12, wherein a plurality of diagonal fringe portions are located around side edges of the depression portion.

14. The electronic device enclosure of claim 11, wherein the two mounting portions extend from the handle along a same direction; and the two extending portions and the operation portion cooperatively form a rectangular-shape operation space.

15. The electronic device enclosure of claim 11, wherein the fixing member comprises a body portion; a slot is defined in the body portion; and the elastically resisting portion is received in the slot.

16. The electronic device enclosure of claim 15, wherein the elastically resisting portion comprises an elastically bending portion connected to the body portion, a connection portion, and an abutting portion extending downwardly from a distal end of the connection portion; and the elastically resisting portion protrudes from a top surface of the body portion.

17. The electronic device enclosure of claim 16, wherein the abutting portion is substantially perpendicular to the connection portion.

18. The electronic device enclosure of claim 16, wherein the elastically resisting portion further comprises a restriction portion extending diagonally from the distal end of the connection portion; and the restriction portion abuts the handle to prevent the handle from moving in a third direction that is perpendicular to the first direction.

19. The electronic device enclosure of claim 12, wherein a thickness of the fixing member is less than or equal to a depth of the depression portion.

* * * * *